United States Patent [19]
Abe et al.

[11] Patent Number: 5,175,115
[45] Date of Patent: Dec. 29, 1992

[54] METHOD OF CONTROLLING METAL THIN FILM FORMATION CONDITIONS

[75] Inventors: Masahiro Abe, Yokohama; Yasukazu Mase, Fujisawa; Toshihiko Katsura, Kawasaki; Masaharu Aoyama, Fujisawa, all of Japan

[73] Assignee: Kabushiki Kaisha Toshiba, Kawasaki, Japan

[21] Appl. No.: 654,488

[22] Filed: Feb. 13, 1991

[30] Foreign Application Priority Data

Feb. 15, 1990 [JP] Japan .................................. 2-34704

[51] Int. Cl.$^5$ ...................... H01L 21/66; G01R 31/26
[52] U.S. Cl. ........................................ 437/8; 437/194; 437/197; 437/247; 427/8; 427/10; 73/766
[58] Field of Search .................. 437/8, 194, 197, 247; 427/10, 8; 73/766

[56] References Cited

U.S. PATENT DOCUMENTS 4,837,183  6/1989  Polito et al. .......................... 437/194
4,970,176  11/1990  Tracy et al. .......................... 437/197
4,975,389  12/1990  Ryan et al. .......................... 437/197

OTHER PUBLICATIONS

I. Ahmad et al., "Application of Protective CVD Coatings . . . ", *Thin Solid Films*, vol. 45 (1977) p. 275.
H. Oikawa et al., "Physical Properties of Vacuum Dep. MO Films", *Oyo Buturi*, vol. 47, No. 3, pp. 192–198, Mar. 1978.
J. Chen et al., "Temperature Effects on Internal Stress in Mo Thin Films . . . " *Thin Solid Films*, vol. 104, No. 1–2, Jun. 1983, pp. 251–255.
A. K. Sinha et al., "The Temperature Dependence of Stresses In Sl Films on Oxidized Si Substrates", *Thin Solid Films*, vol. 48, No. 1, pp. 117–126 (Jan. 1978).
H. Oikawa et al., "Effect of Heat Treatment After Deposition on Internal Stress on Mo Films on SiO$_2$/Si Substrates," *J. Vac. Sci. and Tech.*, vol. 14, No. 5, Sep. 1977, pp. 1153–1156.

*Primary Examiner*—Brian E. Hearn
*Assistant Examiner*—Laura M. Holtzman
*Attorney, Agent, or Firm*—Finnegan, Henderson, Farabow, Garrett and Dunner

[57] ABSTRACT

Measurement of temperature - internal stress characteristics of an Al thin film formed on an Si substrate is performed. The amount of an impurity or impurities mixed in the thin film can be obtained in accordance with the measured characteristics. A migration start temperature of Al atoms in the thin film in the characteristics obtained when the temperature is increased is fed back as information to the thin film formation step, thereby controlling an impurity amount in an atmosphere for forming the thin film.

10 Claims, 3 Drawing Sheets

METHOD OF CONTROLLING METAL THIN FILM FORMATION CONDITIONS

BACKGROUND OF THE INVENTION

1. Field of the Invention

The present invention relates to formation of a metal thin film and, more particularly, to a method of controlling film formation conditions of a thin film required to obtain predetermined film quality.

2. Description of the Related Art

Sputtering, heating deposition, ion plating, plating, and the like are known as a conventional method of forming a metal thin film. In any of these methods, it is important to reduce an impurity amount mixed during a formation process in order to obtain good film quality. The following two methods have been typically, conventionally adopted as a method of reducing the impurity amount to obtain a high-purity metal thin film.

In the first place, the purity of a thin film raw material is improved. Since purity management of a raw material can be comparatively easily performed in mass-production techniques, it is generally performed.

In the second place, an atmosphere in a reaction or formation chamber is kept at a predetermined level to reduce contamination, thereby preventing mixing of an impurity during a thin film formation process. It is difficult to perform an in-process measurement of mixing of an impurity during the film formation process, and this measurement is often unsuitable especially for a mass-production process. In order to control the atmosphere in a reaction or formation chamber, analysis of residual impurity components in the chamber is used. Alternatively, the concentration of an impurity mixed in a thin film is estimated on the basis of characteristic values of a completed thin film, e.g., a hardness, a grain size, and a specific resistance of the thin film, and this information is fed back to the formation process to control the atmosphere in a chamber.

When an Al thin film is to be formed by a sputtering method, for example, film quality depends on a residual gas in a sputtering chamber. Although a mass spectrometer is used to measure this residual gas, it is practically impossible in a mass-production process to continuously measure impurities such as $H_2O$, $N_2$, $O_2$, and $CO$ mixed on the order of several tens ppm in Ar gas used in the sputtering step.

For the above reasons, physical characteristics of a formed film are measured, and normality of formation conditions is determined in accordance with the measurement values. In a mass-production process, information indicating this determination must be rapidly fed back to a formation step. The normality of thin film formation conditions is empirically determined in accordance with a Knoop hardness $H_K$ or a specific resistance $\rho$ of a thin film. Since, however, the physical characteristic values such as a hardness, a grain size, and a specific resistance described above are insensitive to a change of a thin film microstructure, i.e., an impurity amount precipitated in a grain boundary, they cannot be correct indexes for controlling the formation conditions.

SUMMARY OF THE INVENTION

The present invention has been made in consideration of the above situation and has as its object to reliably monitor mixing of a small amount of an impurity or an error in substrate temperature upon film formation by using physical characteristics of a metal thin film different from those used in conventional techniques.

According to the present invention, there is provided a method of controlling formation conditions of a metal thin film to be formed on a substrate, comprising the steps of measuring temperature - internal stress characteristics of a formed metal thin film, and adjusting the formation conditions of the thin film in a formation step on the basis of information obtained from the measured characteristics.

In the preferred aspect of the present invention, the above information is a migration start temperature of thin film constituting atoms in the temperature - internal stress characteristics of the formed metal thin film obtained when the temperature is increased. The above formation condition is, e.g., an impurity amount in an atmosphere or the temperature of the substrate obtained when the thin film is to be formed. In particular, the present invention can be suitably used to control conditions in a step of forming an Al thin film as a conductive layer on a semiconductor substrate consisting of, e.g., Si.

According to the present invention, measurement of the temperature - internal stress characteristics of a thin film in one sample can be finished within 10 to 20 minutes. Therefore, predetermined formation conditions can be reliably controlled by feeding back information obtained from the measurement to the thin film formation step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
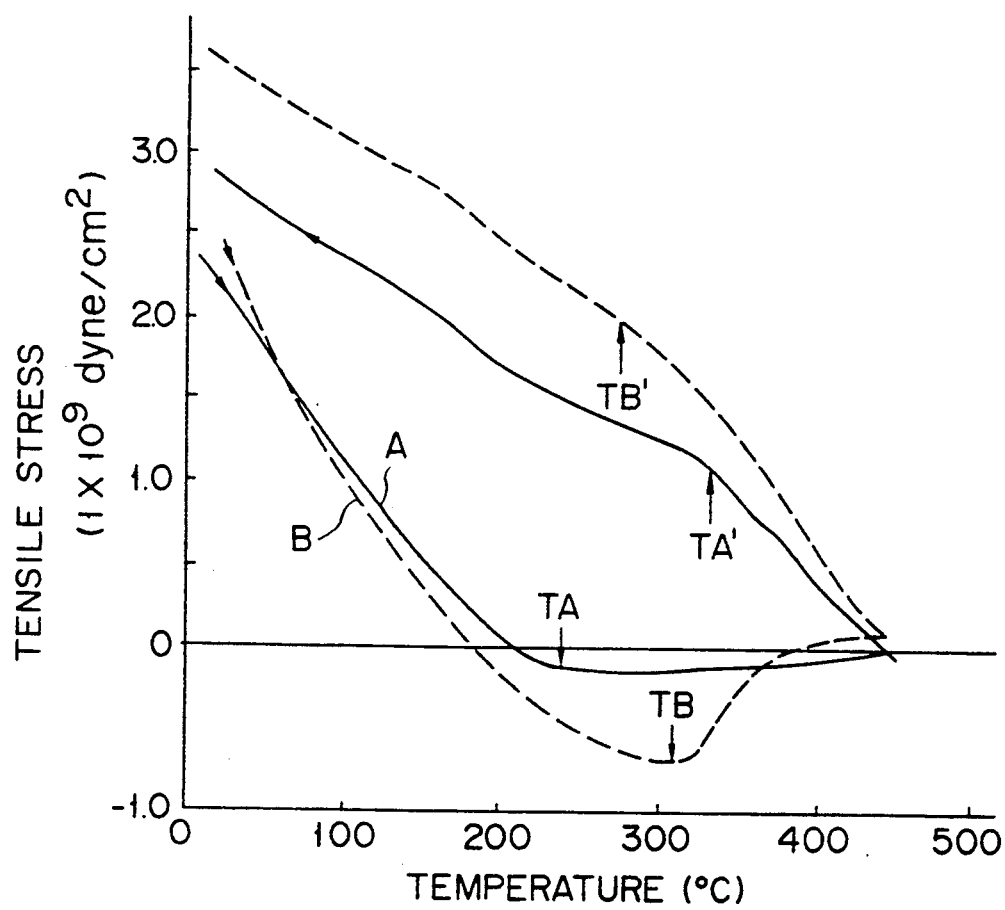
FIG. 1 is a graph showing a relationship between a temperature and an internal stress of each of thin films having different impurity concentrations, in which the abscissa indicates the temperature and the ordinate indicates the stress.

In the present invention, a temperature - internal stress relationship is measured in a plurality of metal thin films formed under different film formation conditions, e.g., different mixed impurity amounts or substrate temperatures upon film formation, and the obtained data are stored. On the basis of these data, a temperature - internal stress characteristic curve of a metal thin film formed as an actual product is obtained after thin film formation, and the impurity concentration of the film or the substrate temperature upon film formation is estimated especially from a migration start temperature of atoms constituting the thin film. Since the feature of a temperature - internal stress curve (loop) drawn upon temperature rise and fall obtained at a different impurity concentration from a predetermined impurity concentration is different from that obtained at a different substrate temperature from a predetermined substrate temperature upon film formation, the two curves can be identified from each other. The obtained information is fed back to the thin film formation step to control the thin film formation conditions. That is, if the impurity concentration is higher than a rated value, for example, an impurity amount in an atmosphere is decreased to reduce the impurity concentration. If the substrate temperature is outside a predetermined value, it is corrected to be close to the predetermined value.

Examples of a metal usable in the present invention are a high-melting point metal such as Al, an Al alloy (e.g., Al-Si and Al-Si-Cu), W, Mo, Ti, Ta, and Zr and a silicide of the high-melting point metal. Although a high stress is normally applied on a high-melting point metal thin film on a Si substrate under room temperature based on a difference between the thermal expansion coefficients of the film and substrate, the applied stress is relaxed by annealing at a temperature of 800° C. An internal stress is measured on the basis of a warpage amount of the film upon annealing to estimate an impurity concentration or a film formation substrate temperature, thereby controlling the thin film formation conditions as described above.

The present invention will be described in more detail below by taking an Al thin film for wiring formed on a silicon semiconductor substrate as an example.

EXAMPLE 1

A 100-μm thick film consisting of a silicon oxide, e.g., silicon dioxide was formed on the surfaces of a silicon semiconductor substrate having (111) orientation. This silicon oxide film was formed to suppress a reaction between Si and Al. The film was formed symmetrically on the upper and lower surfaces of the silicon semiconductor substrate to obtain a dynamically balanced state. A conventionally used 1.0-μm thick Al thin film (containing 1 wt. % of Si) was formed on the silicon oxide film at a substrate temperature of 150° C. by a sputtering method. Upon the thin film formation, a mass spectrometer was mounted on a sputtering apparatus to measure a mixing amount (concentration) of an impurity. The measurement was performed in order to obtain a correlation between the impurity concentration and temperature - internal stress characteristics.

Following the same procedures as described above, two samples A and B whose Al thin films had different impurity concentrations were formed. A total mixed impurity amount ($H_2O$, $N_2$, $O_2$, and CO) of the film of the sample A measured in the sputtering step was 30 ppm or less, and that of the film of the sample B was about 450 ppm.

After the samples A and B were formed, the temperature of each of the samples was changed from room temperature to 450° C., and the internal stress of the metal thin film was measured from a warpage amount of the film or sample at each temperature. FIG. 1 shows the temperature - stress characteristics of the thin film in each of the samples A and B. Referring to FIG. 1, a curve A indicates the characteristics of the sample A, and a curve B indicates those of the sample B.

Since the Al thin film has a thermal expansion coefficient larger than that of the Si substrate, the film is subjected to a tensile stress from the substrate at room temperature lower than the temperature upon thin film formation. This tensile stress is, however, initially, substantially linearly relaxed in the negative direction in accordance with a coefficient which depends on a difference between the thermal expansion coefficients of Al and Si as the temperature is increased. The tensile stress temporarily has negative values (i.e., becomes a compression stress) and then is influenced by Al atom migration in the thin film started at a certain temperature, e.g., $T_A$ or $T_B$ (FIG. 1). For this reason, a rate of change in the stress abruptly changes to set the stress to be close to 0.

When the temperature is decreased from 450° C., the tensile stress is initially, substantially linearly increased in the positive direction in accordance with the coefficient which depends on the difference between the thermal expansion coefficients of Al and Si. Al atom migration occurs at a temperature, e.g., $T_A'$ or $T_B'$ (FIG. 1) in which the tensile stress has been increased to a certain degree, and the rate of change in the stress slightly changes.

When the temperature is increased, while Al atom migration is started at $T_A = 240°$ C. in the sample A, it is started at $T_B = 310°$ C. in the sample B. The migration is started at a higher temperature in the sample B having a high impurity concentration because an impurity precipitated in a grain boundary or the like interferes with the Al atom migration. In the sample B, abrupt stress relaxation is found in a region of higher temperatures. When the temperature is decreased, since the temperature is sufficiently decreased before the Al atom migration occurs in the sample B, almost no change is found in the rate of change in stress.

When a Knoop hardness of each of the samples A and B was measured, a difference in knoop hardness therebetween was determined to fall within the range of variations in consideration of measurement error, i.e., no significant difference was found. In the temperature - internal stress characteristics, however, a definite difference was found between the samples A and B as indicated by the migration start temperatures $T_A$ and $T_B$ shown in FIG. 1.

Figure 2:
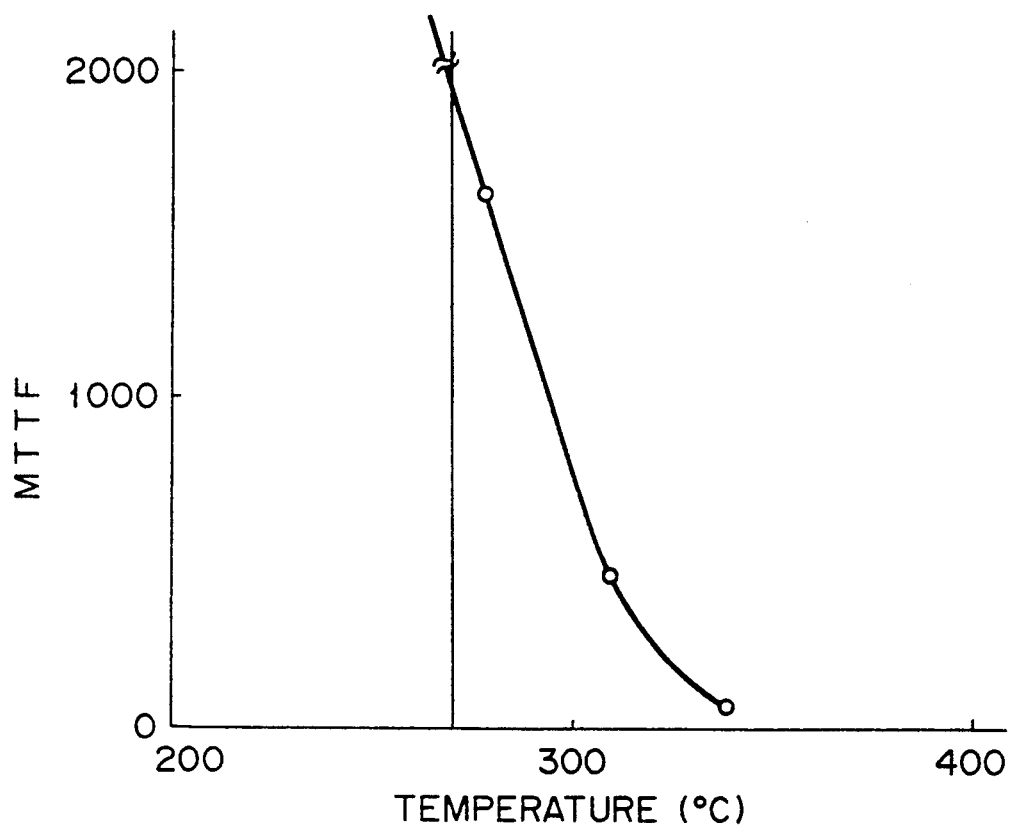
FIG. 2 is a graph showing a relationship between an atom migration start temperature and an MTTF (Mean Time To Fail; to be referred to as MTTF hereinafter) value obtained in a disconnection stress migration test, in which the abscissa indicates the atom migration start temperature and the ordinate indicates the MTTF value.

FIG. 2 shows a relationship between the migration start temperature and an MTTF value obtained in a disconnection stress migration test.

The disconnection stress migration test is a forced test in which a semiconductor device having a zigzagged long wiring layer (e.g., the samples A and B having an Al thin film formed on an Si substrate) is encapsulated in a package constituted by a resin layer or the like and left to stand while a temperature is maintained at about 140° C. to forcibly apply a stress to the wiring layer, thereby measuring a time elapsed before a disconnection occurs. When the temperatures is maintained as described above, an impurity is self-diffused in a grain boundary of the wiring layer to form a notch and stress relaxation propagates to finally break the wiring layer.

The MTTF is a mean time elapsed before devices fail, and whether the MTTF is good or bad is often determined empirically. In the present invention, a device having an MTTF value of 2,000 hours or more is determined to be "good".

The disconnection stress migration test was performed for the samples A and B and other samples at a temperature of 125° C. In this test, while an MTTF value of 2,000 hours or more was obtained in the sample A having $T_A = 240°$ C., the MTTF value of the sample B having $T_B = 310°$ C. was as very bad as 450 hours. As shown in FIG. 2, the migration start temperature need only be 270° C. or less in order to obtain a life of 2,000 hours or more.

Note that instead of the migration start temperature upon temperature rise, the inflection point temperature $T_A'$ or $T_B'$ upon temperature fall can be used as an index of an impurity concentration.

EXAMPLE 2

Two more samples C and D were formed following the same procedures and conditions (including an impurity concentration) as for the sample A of Example 1 except for a substrate temperature. The substrate temperature upon film formation was set at 150° C., 300° C., and 25° C. for the samples A, C, and D, respectively.

Figure 3:
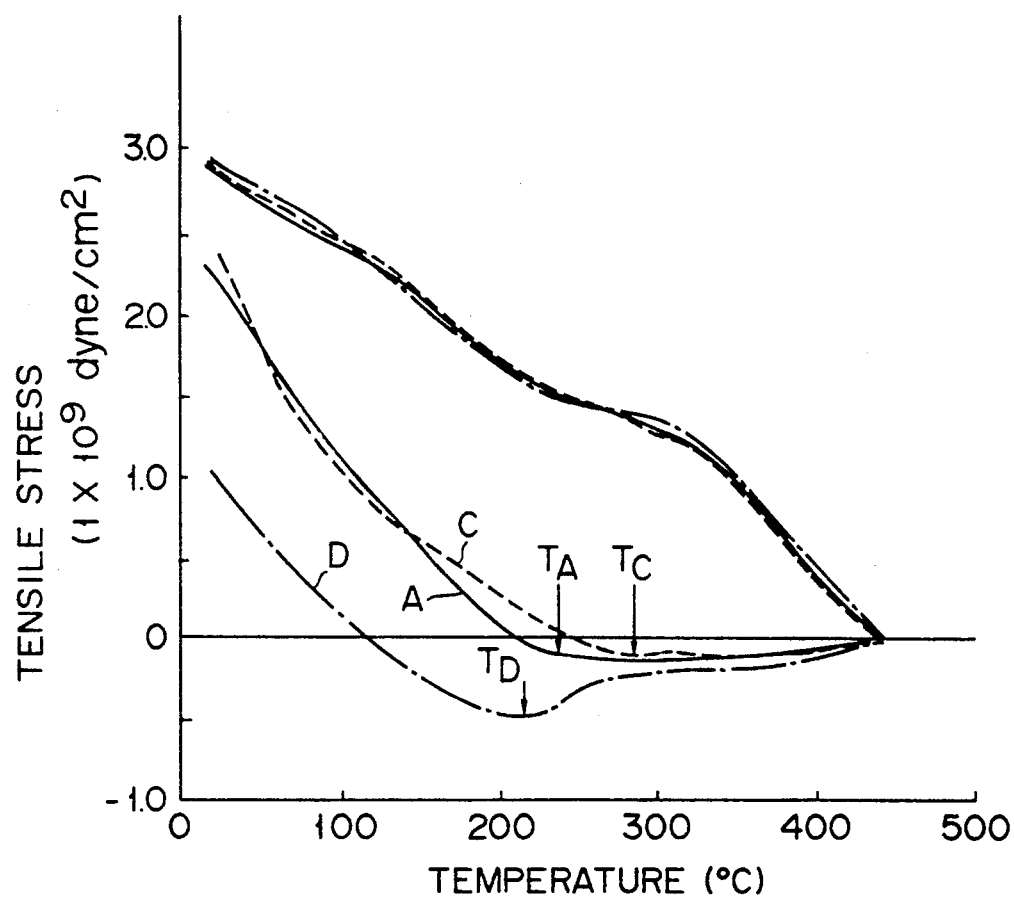
FIG. 3 is a graph showing a relationship between a temperature and an internal stress of each of thin films formed at different substrate temperatures upon film formation, in which the abscissa indicates the temperature and the ordinate indicates the internal stress.

After the samples were formed, the temperature of each of these samples was changed from room temperature to 450° C., and an internal stress of a metal thin film was measured from a warpage amount of the film or sample at each temperature. FIG. 3 shows temperature - stress characteristics of the thin film of each of the samples A, C, and D. Referring to FIG. 3, curves A, C, and D indicate the characteristics of the samples A, C, and D, respectively.

The crystal grain size of a formed Al thin film changes in accordance with the heating temperature of a substrate when the film is formed. The grain sizes of the samples A, C, and D were 2 $\mu$m, 3 to 5 $\mu$m, and 0.3 to 0.5 $\mu$m, respectively. Since the thermal expansion coefficient of the Al thin film is larger than that of the Si substrate, the initial tensile stress of the thin film at room temperature is decreased as the substrate temperature upon film formation is decreased. From these factors, the temperature - stress characteristics of the thin film largely change depending on the substrate temperature upon film formation.

As shown in FIG. 3, the above difference is clearly found at migration start temperatures $T_A$, $T_C$, and $T_D$ obtained when the temperature is increased. Since the impurity concentrations of the samples A, C, and D were low, when the samples were annealed after the temperature was increased up to 450° C., the crystal grain sizes of the thin films became substantially the same among the films, and the shapes of characteristic curves upon temperature fall became substantially the same among the films accordingly. Since the feature of a temperature - internal stress curve (loop) of the thin film obtained at a different substrate temperature from a predetermined substrate temperature upon film formation is different from that obtained at a different impurity concentration from a predetermined impurity concentration, the curve obtained at a different substrate temperature can be distinguished from that obtained at a different impurity concentration.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of controlling formation conditions of a metal film to be formed on a substrate, comprising the steps of:
   forming a first metal film under first conditions including an impurity amount in a formation atmosphere;
   measuring temperature-internal stress characteristics of the first metal film;
   deriving from the characteristics a migration start temperature of atoms constituting the first metal film; and
   adjusting the impurity amount in the formation atmosphere on the basis of a deviation of the migration start temperature from a reference temperature, when forming in the formation atmosphere a second metal film which has substantially the same composition as that of the first metal film.

2. The method according to claim 1 wherein the reference temperature is determined by the steps of:
   forming individually a plurality of metal films, each of which has substantially the same composition as that of the first metal film, under the first conditions except that the metal films are formed by use of different impurity amounts in the formation atmosphere;
   measuring temperature-internal stress characteristics of each of the metal films;
   deriving from the characteristics of each of the metal films a migration start temperature of atoms constituting each of the metal films;
   measuring a relationship between the migration start temperatures and durability of the metal films; and
   selecting the reference temperature on the basis of durability required of the second film.

3. The method according to claim 2, wherein the durability of each of the metal films is determined in terms of MTTF values obtained in a disconnection stress migration test.

4. The method according to claim 2, wherein each of the migration start temperatures is derived from the temperature-internal stress characteristics when a temperature is increased.

5. The method according to claim 4, wherein the impurity amount in the formation atmosphere of the second metal film is set lower than that of the first metal film when the migration start temperature of the first metal film is higher than the reference temperature.

6. The method according to claim 5, wherein the impurity amount is an amount of impurities comprising $H_2O$, $N_2$, $O_2$, and CO.

7. The method according to claim 6, wherein each of the metal films is formed by a sputtering method.

8. The method according to claim 7, wherein the substrate is a semiconductor substrate and each of the metal films is formed of a conductive material.

9. The method according to claim 8, wherein the conductive material is a conductive material selected from the group consisting of W, Mo, Ti, Ta, and Zr, silicides thereof, Al, and Al alloys.

10. The method according to claim 8, wherein the conductive material is Al.

* * * * *

UNITED STATES PATENT AND TRADEMARK OFFICE
CERTIFICATE OF CORRECTION

PATENT NO. : 5,175,115

DATED : December 29, 1992

INVENTOR(S) : Masahiro Abe et al.

It is certified that error appears in the above-identified patent and that said Letters Patent is hereby corrected as shown below:

Abstract, line 4, change "f ilm" to --film--.

Claim 2, column 6, line 25, after "claim 1" insert --,--.

Claim 2, column 6, line 40, "selecting" should align with lines above beginning, respectively "forming" "measuring", "deriving" and "measuring"

Signed and Sealed this

Eighteenth Day of January, 1994

Attest:

BRUCE LEHMAN

*Attesting Officer*  Commissioner of Patents and Trademarks